(12) United States Patent
Liu et al.

(10) Patent No.: US 9,054,195 B2
(45) Date of Patent: Jun. 9, 2015

(54) ARRAY SUBSTRATE, METHOD FOR FABRICATING THE SAME, AND DISPLAY DEVICE

(71) Applicant: Boe Technology Group Co., Ltd., Beijing (CN)

(72) Inventors: Xiang Liu, Beijing (CN); Gang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/079,134

(22) Filed: Nov. 13, 2013

(65) Prior Publication Data

US 2014/0131715 A1     May 15, 2014

(30) Foreign Application Priority Data

Nov. 14, 2012   (CN) .......................... 2012 1 0458462

(51) Int. Cl.
| | |
|---|---|
| *H01L 29/10* | (2006.01) |
| *H01L 21/00* | (2006.01) |
| *H01L 29/786* | (2006.01) |
| *H01L 29/66* | (2006.01) |

(52) U.S. Cl.
CPC ........ *H01L 29/786* (2013.01); *H01L 29/66742* (2013.01)

(58) Field of Classification Search
CPC ....................... H01L 29/786; H01L 29/66742
USPC .................. 257/59, 72, 88; 438/34, 151, 158
See application file for complete search history.

(56) References Cited

U.S. PATENT DOCUMENTS

| | | | | |
|---|---|---|---|---|
| 5,821,133 | A  * | 10/1998 | Kawai et al. ..................... | 438/30 |
| 7,893,440 | B2 * | 2/2011  | Kwon et al. ..................... | 257/72 |
| 7,968,382 | B2 * | 6/2011  | Jinbo et al. ..................... | 438/149 |
| 2009/0004772 | A1* | 1/2009 | Jinbo et al. ..................... | 438/99 |
| 2009/0174835 | A1* | 7/2009 | Lee et al. ........................ | 349/46 |
| 2012/0220077 | A1  | 8/2012 | Ha et al. | |

FOREIGN PATENT DOCUMENTS

| | | |
|---|---|---|
| CN | 1728403 A | 2/2006 |
| CN | 101626036 A | 1/2010 |

OTHER PUBLICATIONS

First Chinese Office Action dated Aug. 25, 2014; Appln. No. 201210458462.9.
Second Chinese Office Action dated Jan. 4, 2015: Appln. No. 201210458462.9.

* cited by examiner

*Primary Examiner* — Nikolay Yushin
(74) *Attorney, Agent, or Firm* — Ladas & Parry LLP

(57) ABSTRACT

Embodiments of the present application provide an array substrate and a method for fabricating the same. The array substrate comprises: a base substrate, a plurality of thin film transistors formed on the base substrate; the array substrate also comprising: a buffer layer formed on the substrate between the substrate and the film transistors; wherein, the buffer layer is a metal oxide film layer. Embodiments of the present application also provide a display device having such array substrate.

20 Claims, 7 Drawing Sheets

ARRAY SUBSTRATE, METHOD FOR FABRICATING THE SAME, AND DISPLAY DEVICE

TECHNICAL FIELD

Embodiments of the present invention relate to a field of display technology, specifically to an array substrate, a method for fabricating the same and a display device having the array substrate.

BACKGROUND

In the field of display technology, a flat panel display device, such as liquid crystal display (LCD) and organic light emitting display (OLED) plays an important role in the field of display technology for its advantages of lightness, thinness, low power consumption, high brightness and high image quality. Especially the flat panel display device with big size, high resolution and high image quality, such as liquid crystal TV, prevails in the current flat panel display device market.

Currently, delay of image signals is one of the key factors that limit progress of the flat panel displaying device with big size, high resolution and high image quality. Delay of image signals is mainly determined by signal resistance R and related capacitance C of gates, gate lines or data lines and the like on the array substrate. As the size of the display device continuously increases and the resolution unceasingly improves, signal frequency applied by a driver circuit also increases, and delay of the images signals gets worse. During displaying an image, gate lines are turned on and the pixels are charged. However, as a result of the delay of images signals, some pixels are insufficiently charged, which makes brightness of the picture non-uniform, and thus the display quality of images is affected badly. Lowering resistance of gates, gate lines and data lines etc. can reduce the delay of the image signals and improve image quality.

At present, the method of lowering resistance of gate lines and date lines is: employing metal Cu with lower resistivity to make gate lines and date lines. However, there are following defects:

A buffer layer is required due to poor adhesion of metal Cu to the substrate, and the buffer layer commonly used is made of Ti or Ti alloy. Since Ti is difficult to etch, usually, acid liquid HF is required in the etch process. If the substrate is a glass substrate, acid HF will erode the glass substrate to some degree, deteriorating the performance of the array substrate.

Further more, in prior arts, in the process of making film of each layer of the array substrate, firstly a pattern of a buffer layer is formed through one patterning process such as coating, masking, exposing, developing, photolithographic etching and so on. Subsequently, a pattern of film of each layer of thin film transistor (TFT) is formed on the substrate on which the buffer layer is formed through another patterning process. Since the patterning process is very complicated, the cost of the array substrate is higher.

SUMMARY

Embodiments of the present application provide an array substrate, a method for fabricating the same and a display device having such array substrate, for enhancing the performance of the array substrate and improving image quality.

Embodiments of the present application provide an array substrate including: a base substrate, a plurality of thin film transistors formed on the base substrate; the array substrate also comprising:

a buffer layer formed on the base substrate and between the base substrate and the thin film transistor; the buffer layer is of a metal oxide film.

The buffer layer is a layer of indium tin oxide film or indium zinc oxide film.

The array substrate also includes pixel electrodes and common electrodes, wherein the pixel electrodes are disposed below the common electrodes and the buffer layer and the pixel electrodes are disposed in the same layer.

The common electrodes and sources/drains of the thin film transistors are disposed in the same layer.

The array substrate also includes pixel electrodes and common electrodes, wherein the pixel electrodes are disposed over the common electrodes and the buffer layer and the common electrodes are disposed in the same layer.

The array substrate also includes gate lines and data lines with the buffer layer disposed in a region corresponding to at least one of gate, gate lines and data lines.

The gate lines and the data lines are disposed in the same layer, wherein the data lines are disconnected at its intersections with the gate lines, and bridged through via holes.

Gate insulating layer of the thin film transistor has a two-layered structure or a three-layered structure;

Gate insulating layer of two-layered structure includes a silicon nitride layer in contact with the gate and a silicon oxide layer in contact with the semiconductor layer.

Gate insulating layer of three-layered structure includes a silicon nitride layer in contact with the gate, a silicon oxide layer in contact with the semiconductor layer and a silicon oxynitride layer sandwiched between the silicon nitride layer and the silicon oxide layer.

Embodiments of the present application provide a display device having the array substrate mentioned above.

Embodiments of the present application provide a method for fabricating the array substrate comprising:

forming a pattern of a buffer layer on the base substrate;

forming patterns of a gate, a source/drain and a semiconductor layer on the base substrate on which the pattern of the buffer layer is formed; and forming patterns of a gate insulating layer and an etch barrier layer; the gate insulating layer disposed between the gate and the semiconductor layer, the etch barrier layer disposed between the semiconductor layer and sources/drains;

wherein, the buffer layer is made of a metal oxide film.

Forming patterns of the gate, the source/drain and the semiconductor layer on the base substrate on which the pattern of the buffer layer is formed and forming patterns of the gate insulating layer and the etch barrier layer, comprising:

forming a pattern of the gate on the base substrate on which the pattern of the buffer layer is formed through a patterning process;

forming patterns of the gate insulating layer and the semiconductor layer on the base substrate on which the patterns of gate is formed by one patterning process;

forming a pattern of the etch barrier layer on the base substrate on which the pattern of the semiconductor layer is formed by a patterning process;

forming patterns of sources/drains on the substrate on which the pattern of the etch barrier layer is formed in one patterning process.

Forming patterns of the gate, the source/drain and the semi-conductor layer and forming patterns of the gate insulating layer and the etch barrier layer on the base substrate on which the pattern of the buffer layer is formed, comprising:

forming patterns of the source/drain on the base substrate on which the pattern of the buffer layer is formed through one patterning process;

forming a pattern of the etch barrier layer on the base substrate on which the patterns of the source/drain are formed using a patterning process;

forming a pattern of the semiconductor layer on the base substrate on which the pattern of the etch barrier layer is formed through a patterning process;

forming patterns of the gate insulating layer and the gate on the base substrate on which the pattern of semiconductor layer is formed through one patterning process.

Forming the pattern of the buffer layer and the pattern of the pixel electrode in one patterning process.

Forming the pattern of the source/drain being and the pattern of the common electrode in one patterning process.

The method also comprises forming patterns of the gate lines and the data lines while forming the patterns of the gate.

Forming the pattern of the buffer layer on the substrate through a patterning process comprises forming the pattern of the buffer layer, corresponding to at least one of the gate, the gate lines and the data lines formed on the base substrate, through a patterning process.

For example, while forming the pattern of the buffer layer, forming the pattern of the common electrode as well through one patterning process comprises: forming the patterns of the buffer layer and the common electrodes at the same time on the substrate in one patterning process.

Embodiments of the present application provide an array substrate, wherein a buffer layer of metal oxide film is formed on the base substrate before each film of layers of the TFT is formed, so that adhesion of the metal film layers in TFT to the substrate is increased, the performance of the array substrate is improved and the image quality of the display device is improved.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
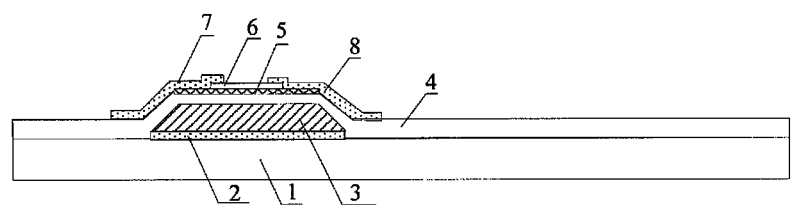
FIG. 1 is a structural diagram of a bottom-gate type TFT array substrate according to an embodiment of the present application.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiments of the present application provide an array substrate, a method for fabricating the array substrate and a display device having such array substrate for enhancing the performance of array substrate and improving image quality.

The embodiments of the present application form a buffer layer of metal oxide on the array substrate prior to forming TFT to strengthen the adhesion of metal film layer of TFT to the substrate; and the buffer layer may be a transparent conductive metal oxide film layer. The buffer layer may be disposed in one and the same layer with the pixel electrodes or the common electrodes and formed in one and the same patterning process, so that process is simplified and the cost of the array substrate is lowered.

An array substrate according to an embodiment of the present application may be but is not limited to be applied to an array substrate of a liquid crystal display of Twisted Nematic (TN) mode, or applied to an array substrate of a liquid crystal display of ADvanced Super Dimension Switch (ADS) mode. ADS technology generates a multi-dimension electric field mainly through an electric field generated by edges of slit electrodes in the same plane and an electric field generated between a slit electrode layer and a plate electrode layer, enabling liquid crystal molecules of all orientations between the slit electrodes and over the slit electrodes in the liquid crystal cell to rotate, so that the efficiency of the liquid crystals is increased and light transmittance is improved. ADS may improve image quality of TFT-LCD product, and have advantages of high resolution, high transmittance, low power consumption, wide viewing angle, high aperture ratio, low chromatic aberration, no push Mura and the like.

The array substrate according to the embodiments of the present application includes a base substrate, a plurality of Thin Film Transistors (TFT) formed on the base substrate; further comprises: a buffer layer formed on the base substrate and between the base substrate and TFT; wherein the buffer layer is a metal oxide film layer.

Now is going to specifically illustrate the array substrate and the method for fabricating the same according to the embodiments of the present application by referring to the figures.

TFT provided by the embodiment of the present application may be a bottom-gate type TFT or a top-gate type TFT. The bottom-gate type and the top-gate type TFT array substrate provided by the embodiment of the present application will be specifically illustrated hereinafter by referring to the figures.

First embodiment: A bottom-gate type TFT array substrate.

The embodiment of the present application provides an array substrate, as shown in FIG. 1, comprising:

A base substrate 1;

A buffer layer 2 formed on the base substrate 1 corresponding to a gate to be formed;

A gate 3 formed on the buffer layer 2;

A gate insulating layer 4 formed on the gate 3;

A semiconductor layer 5 formed on the gate insulating layer 4;

An etch barrier layer 6 formed on the semiconductor layer 5;

A source 7 and a drain 8 formed on the etch barrier layer 6.

The source 7 and the drain 8 may be referred to as a source/drain for short.

The buffer layer according to the embodiment of the present application will be described in details in the following.

The buffer layer may be a metal oxide film layer, for example, a transparent conductive film layer such as Indium Tin Oxide (ITO) film layer, Indium Zinc Oxide (IZO) film layer or other film layers.

To simplify a structure of the array substrate and simplify the fabricating process, the buffer layer according to embodiments of the present application may be disposed in the same layer as other functional film layer, such as pixel electrodes or common electrodes, on the array substrate of same material as the buffer layer.

The buffer layer in accordance with the embodiment of the present application may strengthen the adhesion of the film layer to the base substrate, so that the performance of the TFT array substrate is improved. Moreover, with a transparent conductive film layer used as a buffer layer, since the transparent conductive film layer is relatively dense, diffusion of metal ions of the gate can be prevented, and the performance of the array substrate, specifically the performance of TFT can be improved. And, compared to colored conductive film layer, the transparent conductive film layer can improve the transmittance of the display device and improve brightness and image quality.

The base substrate 1 may be a glass substrate, a quartz substrate or a flexible plastic substrate.

Figure 11:
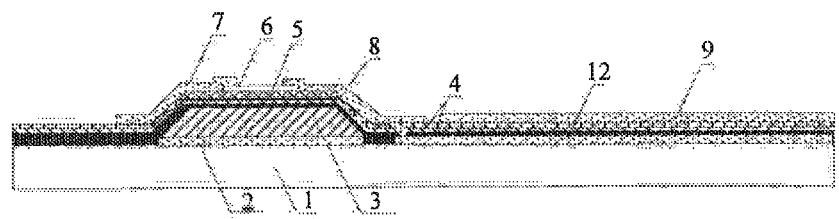
FIG. 11 is a structural diagram of the array substrate according to one embodiment of the present application, wherein the array substrate comprises an insulating layer which is triple-layered.
Figure 12:
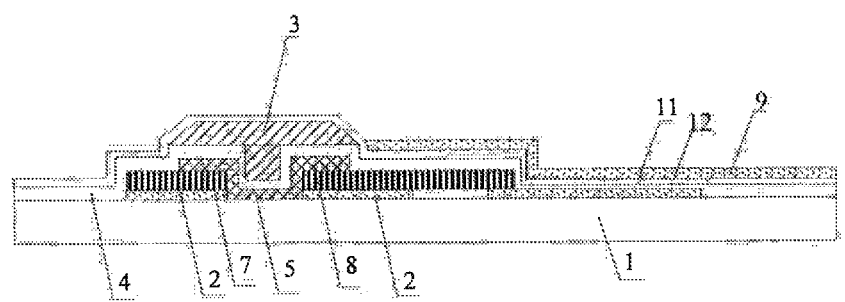
FIG. 12 is a structural diagram of the array substrate according to one embodiment of the present application, wherein the array substrate comprises an insulating layer which is double-layered.

As Illustrated in FIG. 12, The gate insulating layer 4 may be two-layered, for example, comprises a SiNx layer in contact with the gate and a SiOx layer in contact with the semiconductor layer 5, the two-layered gate insulating layer may further prevent the diffusion of the metal ions of the gate. To further prevent the diffusion of the metal ions of the gate, for example, as Illustrated in FIG. 11, the gate insulating layer 4 can be three-layered, comprising: a silicon nitride layer in contact with the gate, a silicon oxide layer in contact with the semiconductor layer 5, and a silicon nitride oxide layer sandwiched between the silicon nitride layer and the silicon oxide layer.

The array substrate also comprises gate lines connected to the gates and data lines connected to the sources. The gate lines of the bottom-gate type TFT array substrate disposed in the same layer with the gate. The gate lines may be disposed in the same layer as the gate or may be disposed in the same layer as the source. When data lines are disposed in the same layer as the gates, the gates and the data lines are disposed transversely and longitudinally, respectively, and intersected. The data lines are disconnected at the position intersected with the gate lines and are bridged through via holes.

The buffer layer may be disposed in a region corresponding to at least one of the gate, the gate lines and the data lines, to enhance adhesion of each functional film layer to the substrate.

Figure 2:
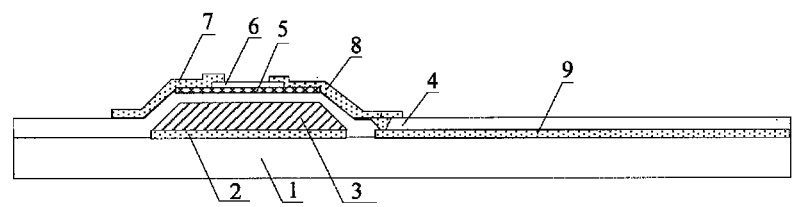
FIG. 2 is a structural diagram of an array substrate with pixel electrodes according to an embodiment of the present application.

As shown in FIG. 2, the array substrate according to the embodiment of the present application further comprises pixel electrodes 9, the pixel electrodes 9 being in the same layer as the buffer layer 2 and the both are formed in one patterning process.

Figure 3:
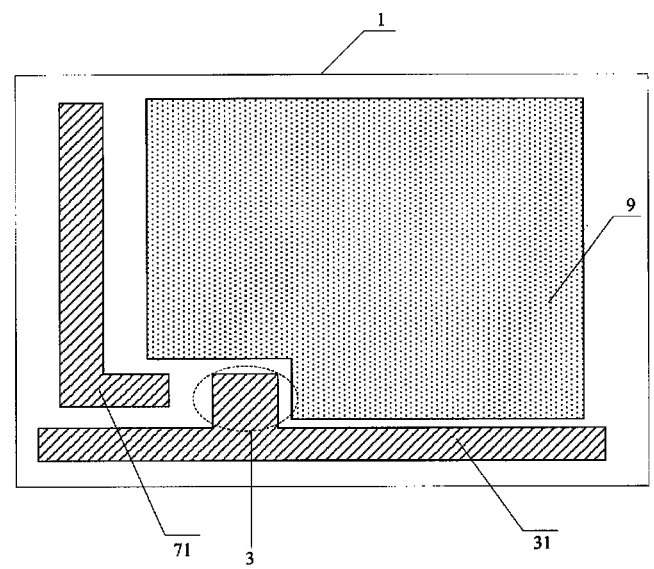
FIG. 3 is a plane diagram of an array substrate on which gates, gate lines, data lines and pixel electrodes are formed according to an embodiment of the present application.

FIG. 3 is a structural diagram of the array substrate according to the embodiment of the present application, wherein the gate 3, the gate lines 31, the data lines 71 are disposed in the same layer on the substrate 1. The array substrate shown in FIG. 3 also comprises pixel electrodes 9 which are formed prior to the gate 3, the gate lines 31 and the data lines 71.

It should be noted that, the pixel electrodes and the drain which are disposed on different layers are connected to each other through via holes.

Of course, the buffer layer 2 is not limited to being disposed in the same layer as the pixel electrodes 9. For example: it may also be disposed in the same layer as the common electrodes or common lines.

The array substrate of the embodiment of the present application also comprises common electrodes. In the array substrate as shown in FIG. 2, the pixel electrodes 9 are disposed on the base substrate and in the same layer as the buffer layer 2, while the common electrodes are on corresponding positions over the TFT on the substrate.

In the ADS liquid crystal display panel, one possible arrangement is that the common electrodes of the array substrate may also disposed under the pixel electrodes. The buffer layer 2 of the embodiment of the present application may also in the same layer as the common electrodes and the both are formed in one patterning process.

In the ADS liquid crystal displaying panel, another possible arrangement is that common lines of the array substrate connected to the common electrodes are formed on the base substrate. Therefore, the buffer layer according to the embodiment of the present application may also be a conductive film layer disposed in the same layer as the common lines.

That is, when the pixel electrode and the buffer layer are disposed in different layers, the array substrate according to the embodiment of the present application also comprises common electrodes disposed in the same layer as the buffer layer.

The array substrate according to the embodiment of the present application also comprises common lines which are disposed in the same layer as the buffer layer.

Since the common electrodes, the common lines or the pixel electrodes and the like are made of transparent conductive film layer, in the embodiment of the present application, the buffer layer is disposed in the same layer as the common electrodes, the common lines or the pixel electrodes, and is formed in one and the same patterning process. Such configuration simplifies the structure of the array substrate and saves the processes.

It is interpreted by taking the common electrodes, the common lines and the pixel electrodes as an example that it is possible for the buffer layer to be disposed in the same layer as the common electrodes, the common lines or the pixel electrodes in one patterning process without additional process when forming functional film layers on the array substrate. Any other film layer that can be formed in the same patterning process as the buffer layer is included in the gist of the present application, which will not be listed one by one.

It should be noted that, when the pixel electrodes are located below the common electrodes, the common electrode and the source drain can be formed in one and the same patterning process. The common electrode is normally a transparent metal oxide film layer, for example ITO or IZO. Therefore, the source/drain may also be a transparent metal oxide conductive electrode. Making the source drain and the common electrodes in one and the same patterning process can simplify the device structure and simplify the making process of the device.

Figure 4:
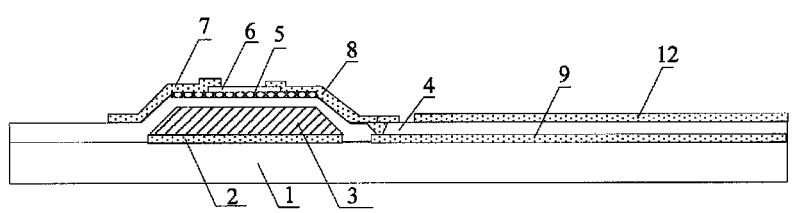
FIG. 4 is a structural diagram of an array substrate with common electrodes according to an embodiment of the present application.

On the basis of FIG. 3, the array substrate as shown in the FIG. 4 also includes common electrodes 12 which are disposed in the same layer as the source 7 and the drain 8.

The embodiment of the present application is described by taking the structure in which the buffer layer is disposed in the same layer as the pixel electrodes or the common electrodes as an example. The buffer layer according to the embodiment of the present application may be in the same layer as any film layer of metal oxide.

Second embodiment: top-gate type TFT array substrate.

The array substrate according to the second embodiment is similar to the structure of the array substrate of the first embodiment and differs in that positions of each film layer of TFT on the array substrate with respect to the base substrate change.

Figure 5:
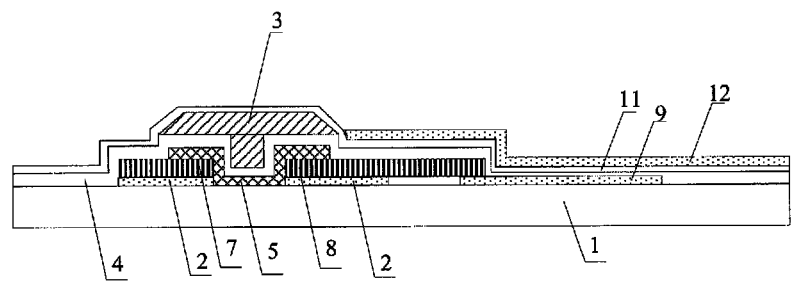
FIG. 5 is a structural diagram of a top-gate type TFT array substrate according to an embodiment of the present application.

As shown in FIG. 5, the array substrate provided by this embodiment of the present application, includes:

A base substrate 1;
A buffer layer 2 formed on the base substrate 1;
A source 7 and a drain 8 formed on the buffer layer 2;
An etch barrier layer 6 formed on the source 7 and the drain 8;
A gate insulating layer 4 formed on the semiconductor layer 5;
A gate 3 formed on the gate insulating layer 4;
A passivation layer 11 formed on the gate 3; and
Common electrodes 12 formed on the passivation layer 11.

Since the source drain is formed before the semiconductor layer in the top-gate type TFT array substrate, the etch barrier layer is unnecessary and is not illustrated in FIG. 4.

Furthermore, the array substrate according to the second embodiment further comprises gate lines connected to the gate and data lines connected to the source, with the data lines disposed in the same layer as the source. The gate lines may be disposed in the same layer as the gate or may be disposed in the same layer as the source. When the gate lines and the gate are in different layers, they are electrically connected through via holes.

Other structures are similar to the structure of the first embodiment, and will not be will not be elaborated here.

The common electrodes provided in the first and second embodiments of the present application may be transparent conductive electrode, and are made from for example ITO or IZO.

The semiconductor layer provided by all the embodiments of the present application can be made of metal oxide, such as indium gallium zinc oxide (IGZO), hafnium indium zinc oxide (HIZO), indium zinc oxide (IZO), a-InZnO (amorphous indium zinc oxide), a-ZnO (amorphous Zinc Oxide):F, $In_2O_3$:Sn, a-$In_2O_3$ (amorphous $In_2O_3$):Mo, $Cd_2SnO_4$, a-ZnO (amorphous Zinc Oxide):Al, a-$TiO_2$ (amorphous $TiO_2$):Nb, Cd—Sn—O or other metal oxide.

The gate provided by the embodiment of the present application may be made of metal film layer, such as Cr, W, Ti, Ta, Mo and the like, or alloy of at least two of the above metals.

In the above first and second embodiments, to improve conductive performance of the semiconductor layer in TFT, the TFT also includes: a first ohm contact layer and a second ohm contact layer located on upper and lower sides of the semiconductor layer and in contact with the semiconductor layer. The first ohm contact layer is located between the gate insulating layer and the semiconductor layer and the second ohm contact layer is located between the semiconductor layer and the source/drain.

The first ohm contact layer and the second ohm contact layer may be a doped semiconductor layer with better conductivity.

It should be noted that, the array substrate or TFT pertained the embodiment of the present application is merely demonstrating the inventive concept of the present disclosure, in the specific implementation, many other functional film layers can be included, in addition to the structure of the array substrate of the present disclosure. For example, the array substrate may comprise functional film layer structure of display region and film layer structure of the wire region at the periphery of the display region. Each film layer structure of the wire region at the periphery of the displaying region is formed while forming the display region. However, sequence of the film layers of the display region may have many variations, as long as elements (such as the gate, the source, the drain and the pixel electrodes and the like) necessary to make panel driver ensure the panel is normally driven. Thus, structure of the film layers at the periphery correspondingly has many variations.

The number of each insulating layer mentioned in the embodiments of the present application, such as the gate insulating layer, the etch barrier layer, the passivation layer etc., is not limited to one or more. Each insulating layer may be made of silicon nitride, silicon oxide or silicon nitride oxide or alumina, and may also made of other insulating material, as long as the insulation between each metal film layer is ensured and conductive elements (such as connecting electrodes made of ITO material) connected to outside are included.

Methods of making the above array substrate of the embodiments of the present application will be explained in details in the following.

A method of making the array substrate according to the embodiments of the present application includes the following steps:

Step S11, forming pattern of a buffer layer on a base substrate;

Step S12, forming patterns of a gate, a source/drain and semiconductor layer on the base substrate formed with the buffer layer; and forming patterns of gate insulating layer and etch barrier layer; the gate insulating layer located between the gate and the semiconductor layer, the etch barrier layer located between the semiconductor layer and the source/drain; wherein, the buffer layer is a metal oxide film layer.

In the process of making the array substrate, each film layer mentioned above is formed by patterning processes. The patterning process refers to the process such as masking, exposing, developing, lithographing, etching and etc., for making patterns. Usually, there are a plurality of ways of forming a layer, such as depositing, coating and sputtering, in which only one or several manners will be illustrated in the following.

For example, forming pattern of the gate on the base substrate by patterning process includes following steps: first, depositing gate film layer on the base substrate, and coating photoresist, forming photoresist patterns by exposing and developing the photoresist with a mask plate, next using the photoresist patterns as an mask to remove corresponding material of film layer through etch and etc., and removing the remaining photoresist, finally resulting pattern of the gate on the base substrate.

A method of making the bottom-gate type TFT array substrate provided by the embodiment of the present application, comprises:

Step S21, forming a pattern of a buffer layer on the base substrate by patterning process, the pattern of the buffer layer at least corresponding to a pattern of a gate to be formed;

Step S22, forming the pattern of the gate on the base substrate formed with the buffer layer patterns by patterning process;

Step S23, depositing an insulating layer and a metal oxide film layer on the base substrate successively, forming a pattern of the insulating layer and a pattern of the semiconductor layer on the base substrate formed with the gate patterns through one patterning process;

Step S24, forming a pattern of an etch barrier layer on the base substrate formed with the pattern of the semiconductor layer by patterning process;

Step S25, forming a pattern of a source/drain sequentially on the base substrate formed with the pattern of the etch barrier layer through one patterning process.

Further, in the step S21, the buffer layer may also correspond to gate lines and data lines to be formed. Correspondingly, in the step S22, the gate lines and the data lines are also formed while forming the gate, and the data lines are disconnected at the position intersected with the gate lines. The gate, the gate lines and the data lines are formed in one and the same patterning process.

Further, in the step S21, the pixel electrodes may also be formed while the buffer layer is formed, the both are formed in one patterning process.

Further, in the step S25, when the source drain is formed, the common electrodes and connection lines for connecting the disconnected data lines are formed as well. The source/drain and the common electrodes may be made of the same material. The source/drain and the common electrodes may be transparent conductive film layers.

Further, in the step S24, when the etch barrier layer is formed, contact via holes by which the source are connected to the data lines and the semiconductor layer, contact via holes by which the drain contact the semiconductor layer and the pixel electrodes, and contact via holes between the disconnected data lines and the connection lines for connecting to the disconnected data lines are also formed.

A method for making the top-gate type TFT array substrate according to the embodiment of the present application comprising the following steps:

Step S31, forming a pattern of a buffer layer on the base substrate by patterning process, the pattern of the buffer layer patterns at least corresponding to a pattern of a source/drain to be formed;

Step S32, forming a pattern of a source/drain on the base substrate formed with the buffer layer by one patterning process;

Step S33, depositing sequentially an insulating layer and a metal oxide film layer on the base substrate, forming a pattern of an etch barrier layer and a pattern of a semiconductor layer on the base substrate formed with the source drain patterns by one patterning process;

Step S34, forming a pattern of a gate insulating layer on the base substrate formed with the pattern of the semiconductor layer by a patterning process;

Step S35, forming a pattern of a gate on the base substrate formed with the pattern of the gate insulating layer by a patterning process.

The method for making the bottom-gate type or top-gate type TFT array substrate which has been described above, further comprises: forming a pattern of pixel electrode while forming the pattern of the buffer layer on the base substrate. The buffer layer and the pixel electrode patterns are formed at the same time on the base substrate by one patterning process.

The method may also comprise forming a pattern of common electrodes when forming the pattern of the buffer layer. The buffer layer and the pixel electrode patterns are formed at the same time on the substrate by one patterning process.

As for the bottom-gate type TFT, the gate lines and the data lines may be formed when forming the gate.

As for the top-gate type TFT, the gate lines and the data lines can be formed when forming the source/drain.

The gate and the gate lines are electrically connected through via holes at appropriate position when they are formed in different processes.

The source and the data lines are electrically connected through via holes at appropriate position when they are formed in different processes.

When the drain and the pixel electrodes are electrically connected through via holes at appropriate position when they are formed in different processes.

It should be noted that, the TFT according to the embodiments of the present application may be an amorphous silicon TFT, or may be a metal oxide TFT.

It should be noted that, the method may also comprise forming a pattern of the pixel electrode or the common electrode on the base substrate after forming the pattern of the common electrodes or the pixel electrodes which are in the same layer as the buffer layer.

Specific patterning process for fabricating a TFT substrate or an array substrate will be illustrated below by taking the array substrate as shown in FIG. 4 disposed in the same layer as the data lines and the gate as an example A method for fabricating array substrate according to the embodiment of the present application comprises:

Step one, forming patterns of a buffer layer 2 and a pixel electrodes 9 on a base substrate, as shown in FIG. 4.

The buffer layer corresponds to a gate, gate lines and data lines, that is to say, the buffer layer is formed directly below the gate, the gate lines and the date lines.

Figure 6:
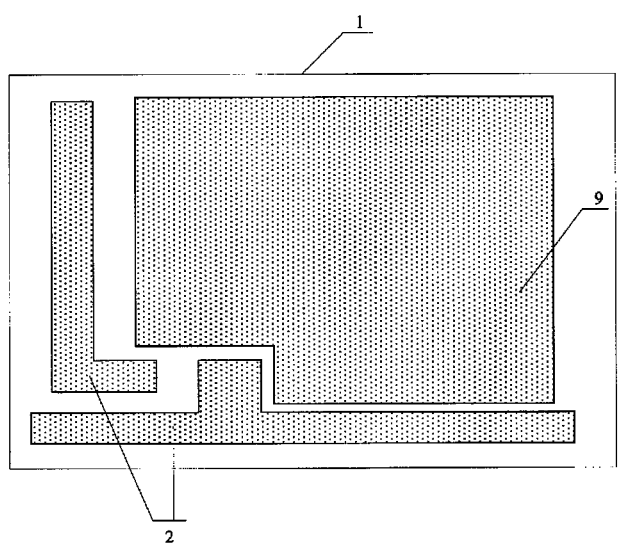
FIG. 6 is a plane diagram of a bottom-gate type TFT array substrate formed with a buffer layer according to an embodiment of the present application.

For example, on the transparent glass substrate or quartz, a transparent metal oxide film layer with thickness of about 300 Å-about 1500 Å is deposited by sputtering or thermal evaporation, then a pattern of pixel electrodes and a pattern of a buffer layer corresponding to the gate, the gate lines and the data lines through patterning process, such as masking, exposure, development, photolighographic etch and the like, are formed. FIG. 6 illustrates a plane view of the buffer layer 2 and the pixel electrodes 9 formed.

The transparent metal oxide film layer may be an ITO film layer or an IZO film layer, or any other transparent metal oxide film layer. The pixel electrodes, patterns of the gate and the gate lines on the buffer layer patterns, patterns of the data lines on the buffer layer are formed by one common photolighographic process, without additional process flow compared to the prior art. The buffer layer 2 and the pixel electrode 9 are formed as shown in FIG. 6.

Step two, forming patterns of the gate, the gate lines and the data lines.

A metal film layer with thickness of 2000 Å-5000 Å is deposited on the base substrate through sputtering or thermal evaporation. Patterns of the gate, the gate lines and the data lines are formed by one masking, exposure and development, and photolighographic etch process.

Patterns and positions of the gate, the gate lines and the data lines formed are the same as those in prior arts, and will not be elaborated here.

Materials for the metal film layer used to form the gates, the gate lines and the data lines may be Cr, W, Ti, Ta, Mo and the like, or alloy of at least two of the above metals. Patterns of the gates, the gate lines and the data lines formed are as shown in FIG. 3.

FIG. 3 just illustrates a gate line and a data line corresponding to one pixel. Each data line arranged longitudinally is disconnected at the portions intersected with the gate lines and then bridged through via holes.

Figure 7:
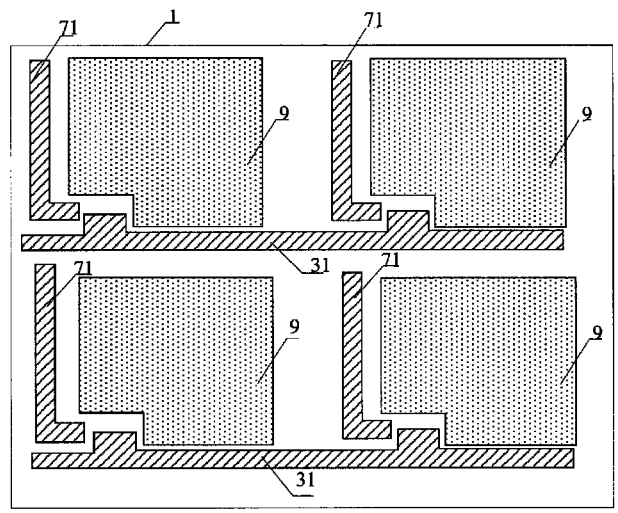
FIG. 7 is a plane diagram of a TFT array substrate including a plurality of gate lines and data lines according to an embodiment of the present application.

In FIG. 7, arrangement of the gate lines and the data lines corresponding to a plurality of pixels is shown.

Step three, forming patterns of the gate insulating 4 and the semiconductor layer 5.

Figure 8:
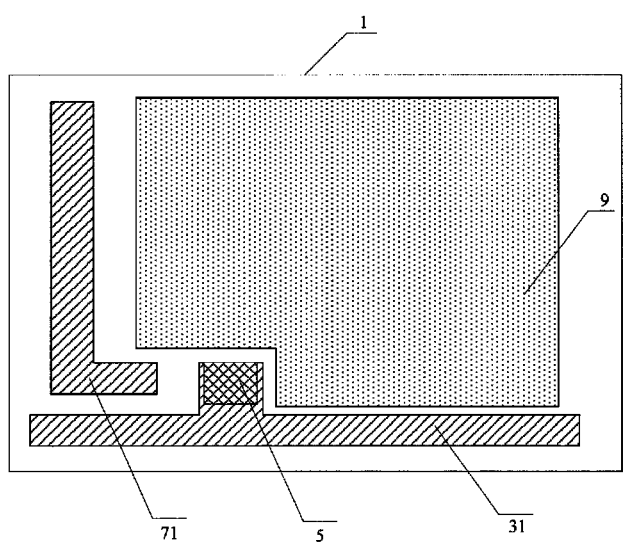
FIG. 8 is a structural diagram of the array substrate of FIG. 6 after forming a pattern of the semiconductor layer on the TFT array substrate.

A first insulating layer with thickness of 2000 Å-5000 Å is continuously deposited through PECVD on the base substrate after the step two, the first insulating layer being a SiNx film layer. Next, a second insulating layer is deposited on the SiNx film layer by the same deposition method, the second insulating layer being the SiOx film layer. Then, a metal oxide film layer with thickness of 50 Å-1000 Å is continuously deposited through sputtering. Pattern of the semiconductor layer is formed through one exposure and development and photolighographic etch process. The fainted semiconductor layer pattern 5 is shown in FIG. 8.

The reactive gas for forming the SiNx film layer may be a mixture of $SiH_4$, $NH_3$ and $N_2$, or a mixture of $SiH_2Cl_2$, $NH_3$ and $N_2$. The reactive gas for forming the SiOx film layer may be a mixture of $SiH_4$, $NH_3$ and $O_2$, or a mixture of $SiH_2Cl_2$, $NH_3$ and $O_2$.

The double-layered gate insulating layer may further inhibit diffusion of the gate or the gate lines, improve performance of TFT and improve image quality of the displaying device, compared to mono-layered gate insulating layer.

The metal oxide may be IGZO, HIZO, IZO, a-InZnO, a-Zno:F, $In_2O_3$:Sn, a-$In_2O_3$:Mo, $Cd_2SnO_4$, a-ZnO:Al, a-$TiO_2$:Nb, Cd—Sn—O or other metal oxide.

Step four, forming pattern of the etch barrier layer 6 as shown in FIG. 4.

Figure 9:
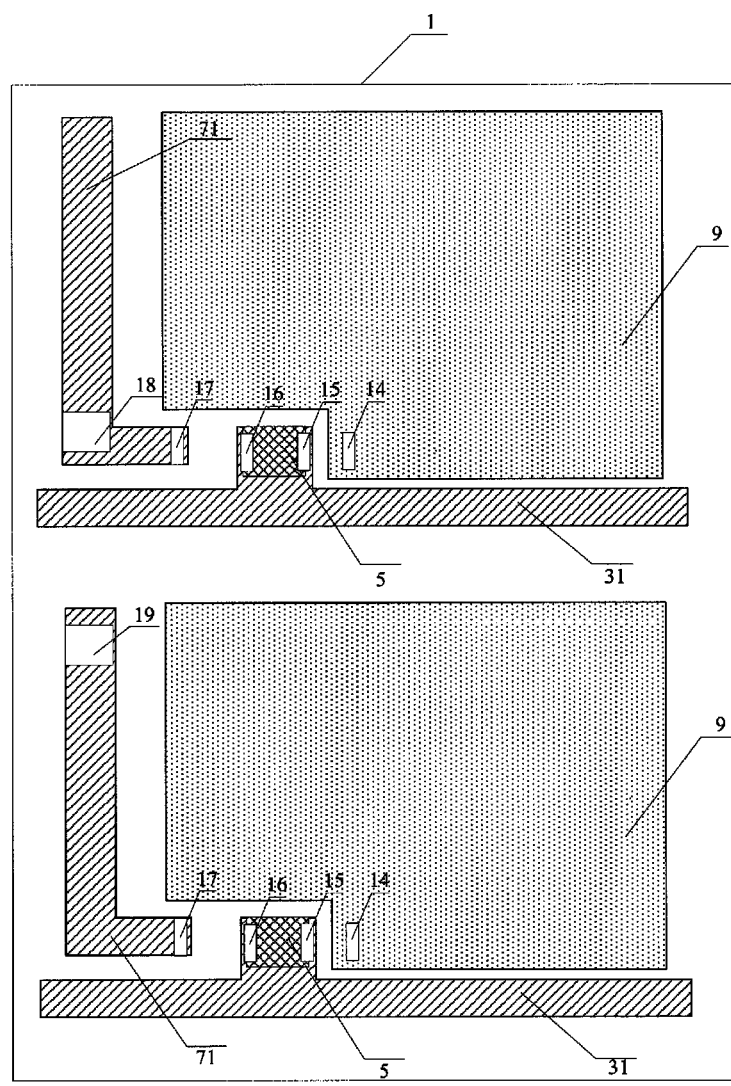
FIG. 9 is a plane diagram of an array substrate formed with various contact via holes on an etch barrier layer according to an embodiment of the present application.

After the step three, an insulating layer with thickness of 1000 Å-3000 Å is continuously deposited on the substrate through PECVD, the insulating layer being the etch barrier layer. Material for the etch barrier layer may be selected from oxide, nitride or oxide nitride, and the corresponding reactive gas may be $SiH_4$, $NH_3$, $N_2$, or $SiH_2Cl_2$, $NH_3$, $N_2$. To improve the performance of the oxide TFT, similar to the process of implementing the gate insulating layer, the etch barrier layer may be designed as having two layers with the first layer being SiNx and the second layer being SiOx. Contact hole 14 between the source and the pixel electrodes 9, contact hole 15 between the drain and the semiconductor layer 5, contact hole 16 between the source and the semiconductor layer 5, contact hole 17 between the source and the data lines and via hole 18 and via hole 19 for connecting the data lines disconnected longitudinally, as shown in FIG. 9, are formed by one exposure and development and photolighographic etch process on the basis of forming two layers of insulating layer. The data lines below the via hole 18 and the via hole 19 are connected through bridges. FIG. 9 shows the disposition position of each of the via holes.

It should be noted that, via holes connecting the drains and the pixel electrodes, via holes connecting the sources and the semiconductor layer, via holes connecting the drains and the semiconductor layer and via holes connecting the sources and the data lines, are also formed in this step.

Step five, patterns of the source 7, the drain 8 and the common electrodes 12 are formed.

Figure 10:
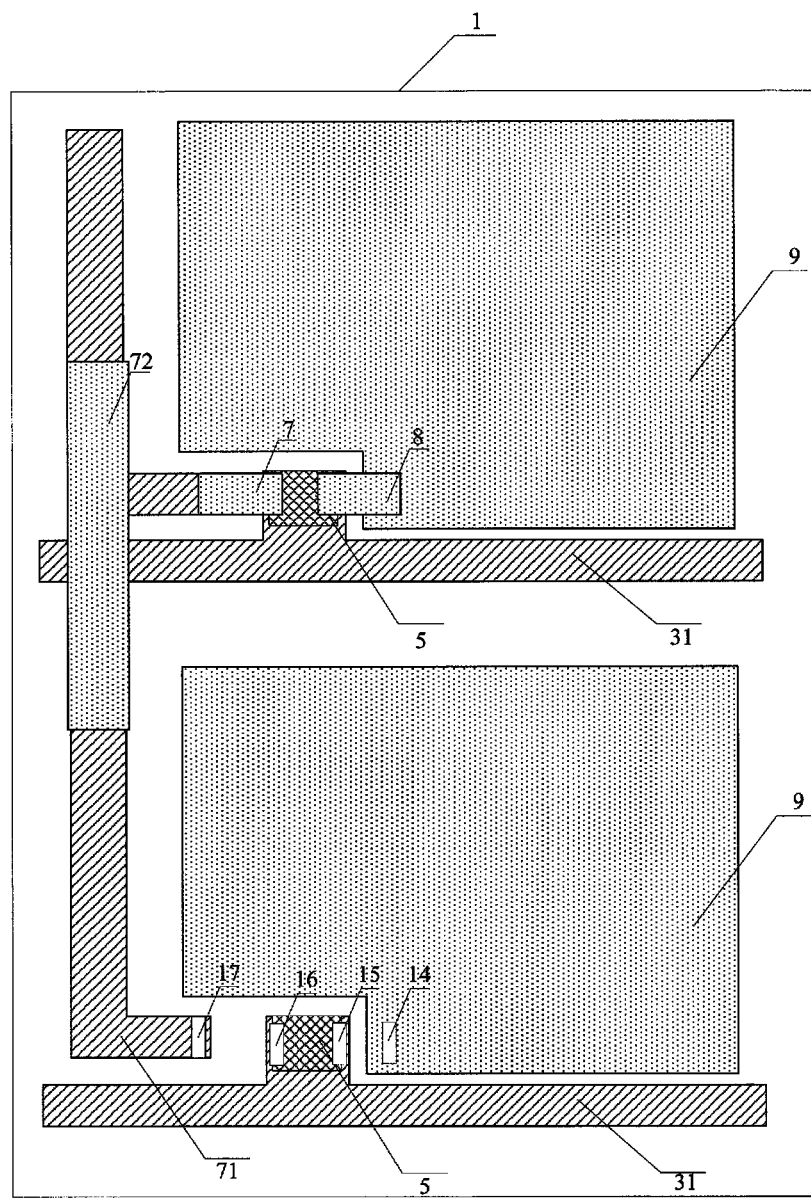
FIG. 10 is a plane diagram of an array substrate formed with sources/drains and connection lines connected to data lines according to an embodiment of the present application.

A metal film layer with thickness of 1000 Å-6000 Å is deposited on the substrate through sputtering or thermal evaporation. The source 7, the drain 8 shown in FIG. 10 and the common electrodes (not illustrated in FIG. 10) and the connection lines 72 for connecting the disconnected data lines are formed through patterning process such as masking, exposure and development, photolighographic etch and the like.

The connection lines 72 for connecting the disconnected data lines may cover a portion of the disconnected data lines, and may also cover the entire data lines. When the entire data lines are covered, the connection lines 72 can protect data lines, and inhibit diffusion of metal ions of the data lines.

The connection lines 72 for connecting the disconnected data lines may cover a portion of the data lines disconnected and may also cover the gate lines, and serve to protect the gate so that diffusion of metal ions of the gate is inhibited.

The patterning process of forming a top-gate type TFT array substrate is similar to the patterning process of forming the bottom-gate type TFT array substrate comprising step one to step five, and will not be elaborated here.

Embodiments of the present application also provide a display device comprising the foregoing array substrate, the display device may be one such as a liquid crystal panel, a liquid crystal display, a liquid crystal TV, an OLED panel, an OLED display, and an OLED TV or an electronic paper.

An example of the display device is a liquid crystal display device in which an array substrate and an opposite substrate are cell-assembled to form a liquid crystal cell where liquid crystal material is filled. The opposite substrate is for example a color film substrate. A pixel electrode of each pixel unit of the array substrate is used to apply an electric field for controlling the rotation of liquid crystal materials in order for display. In some examples, the liquid crystal display also includes a back light source for providing back light to the array substrate.

Another example of the display device is an OLED display device in which thin film transistor of each pixel unit of the array substrate is connected to anode or cathode of an OLED device for driving organic light emitting material to emit light in order for display.

In other words, embodiments of the present application provide an array substrate, wherein a metal oxide buffer layer is formed on the substrate prior to each film layer of TFT, so that adhesion of the metal film layers in TFT to the substrate is enhanced, the performance of the array substrate is improved and the image quality of the displaying device is improved. The buffer layer is disposed in the same layer as the transparent metal oxide film layer on the array substrate and these components are completed through one and the same patterning process, so that the patterning process is saved, raw materials are saved, the performance of the array substrate is improved and the manufacturing cost of the array substrate is lowered.

The foregoing are merely exemplary embodiments of the invention, but are not used to limit the protection scope of the invention. The protection scope of the invention shall be defined by the attached claims.

The invention claimed is:

1. An array substrate, comprising: a base substrate, a plurality of thin film transistors formed on the base substrate; the array substrate also comprising:
   a buffer layer formed on the base substrate between the base substrate and at least one of the plurality of thin film transistor;
   wherein the buffer layer is a metal oxide film layer; and
   wherein the array substrate also comprises pixel electrodes and common electrodes, the pixel electrodes are disposed below the common electrodes, and the buffer layer and the pixel electrodes are disposed in one layer, and the common electrodes and a source/drain of at least one of the plurality of thin film transistors are disposed in one layer.

2. The array substrate according to claim 1, wherein the buffer layer is an indium tin oxide film layer or an indium zinc oxide film layer.

3. The array substrate according to claim 1, wherein the array substrate also comprises gate lines and data lines, the buffer layer disposed in a region corresponding to at least one of gates, gate lines and data lines.

4. The array substrate according to claim 3, wherein the gate lines and the data lines are disposed in one layer, the data lines are disconnected at intersections with the gate lines and bridged through via holes.

5. The array substrate according to claim 1, wherein the array substrate comprises an insulating layer which is double-layered and has a silicon nitride layer in contact with gate and a silicon oxide layer in contact with the semiconductor layer.

6. The array substrate according to claim 1, wherein the array substrate comprises an insulating layer which is triple-layered and has a silicon nitride layer in contact with gate, a silicon oxide layer in contact with the semiconductor layer and a silicon nitride oxide layer sandwiched between the silicon nitride layer and the silicon oxide layer.

7. A display device which comprises the array substrate of claim 1.

8. An array substrate, comprising: a base substrate, a plurality of thin film transistors formed on the base substrate; the array substrate also comprising:
   a buffer layer formed on the base substrate between the base substrate and at least one of the plurality of thin film transistors;
   wherein the buffer layer is a metal oxide film layer; and wherein the array substrate also comprises pixel electrodes and common electrodes, the pixel electrodes are disposed above the common electrodes, and the buffer layer and the common electrodes are disposed in one layer.

9. The array substrate according to claim 8, wherein the buffer layer is an indium tin oxide film layer or an indium zinc oxide film layer.

10. The array substrate according to claim 8, wherein the array substrate also comprises gate lines and data lines, the buffer layer disposed in a region corresponding to at least one of gates, gate lines and data lines.

11. The array substrate according to claim 10, wherein the gate lines and the data lines are disposed in one and the same layer, the data lines are disconnected at intersections with the gate lines and bridged through via holes.

12. The array substrate according to claim 8, wherein the array substrate comprises an Insulating layer which is double-layered and has a silicon nitride layer in contact with gate and a silicon oxide layer in contact with the semiconductor layer.

13. The array substrate according to claim 8, wherein the array substrate comprises an insulating layer which is triple-layered and has a silicon nitride layer in contact with gate, a silicon oxide layer in contact with the semiconductor layer and a silicon nitride oxide layer sandwiched between the silicon nitride layer and the silicon oxide layer.

14. A method of fabricating an array substrate comprising:
    forming a pattern of a buffer layer on a base substrate;
    forming patterns of a gate, a source/drain and a semiconductor layer on the base substrate formed with the pattern of the buffer layer; and
    forming patterns of a gate insulating layer and an etch barrier layer, the gate insulating layer disposed between the gate and the semiconductor layer, the etch barrier layer disposed between the semiconductor layer and the source/drain;
    wherein, the buffer layer is a metal oxide film layer.

15. The method according to claim 14, wherein forming patterns of a gate, a source/drain and a semiconductor layer on the base substrate formed with the pattern of the buffer layer; and forming patterns of a gate insulating layer and an etch barrier layer, comprises:
    forming a pattern of the source/drain on the base substrate formed with the pattern of the buffer layer through one patterning process;
    forming a pattern of the etch barrier layer on the base substrate formed with the pattern of the source/drain through a patterning process;
    forming a patter of the semiconductor layer on the base substrate formed with the pattern of the etch barrier layer through a patterning process;
    forming patterns of the gate insulating layer and the gate on the base substrate formed with the pattern of semiconductor layer through a patterning process.

16. The method according to claim 14, wherein forming a pattern of common electrodes and the pattern of the buffer simultaneously through one patterning process.

17. The method according to claim 14, wherein, the forming patterns of a gate, a source/drain and a semiconductor layer on the base substrate formed with the pattern of the buffer layer and the forming patterns of a gate insulating layer and an etch barrier layer, comprising:
    Forming a pattern of the gate on the base substrate formed with the pattern of the buffer layer through a patterning process;
    forming patterns of the gate insulating layer and the semiconductor layer on the base substrate formed with the pattern of the gate through one patterning process;
    forming a pattern of the etch barrier layer on the base substrate formed with the pattern of the semiconductor layer through a patterning process;
    forming a pattern of the source/drain on the base substrate formed with the pattern of the etch barrier layer through one patterning process.

18. The method according to claim 17, wherein a pattern of pixel electrodes are formed while the pattern of the buffer layer is formed in one patterning process.

19. The method according to claim 17, wherein a pattern of the common electrodes are formed while the pattern of the source/drain is formed in one patterning process.

20. The method according to claim 17, further comprising
    forming patterns of the gate lines and the data lines while forming the pattern of the gate;
    Forming a pattern of the buffer layer on the base substrate is to form a pattern of the buffer layer on the base substrate corresponding to at least one of the gate, the gate lines and the data lines to be formed through a patterning process.

* * * * *